United States Patent
Wasson

(10) Patent No.: US 6,463,568 B1
(45) Date of Patent: Oct. 8, 2002

(54) APPARATUS AND METHOD FOR DESIGNING A CIRCUIT USING MINIMUM SLICE CONSTRUCTION AND REPLICATION

(75) Inventor: Stephen L. Wasson, Boulder Creek, CA (US)

(73) Assignee: Morphics Technology, Inc., Campbell, CA (US)

( * ) Notice: Subject to any disclaimer, the term of this patent is extended or adjusted under 35 U.S.C. 154(b) by 0 days.

(21) Appl. No.: 09/565,652

(22) Filed: May 5, 2000

Related U.S. Application Data
(60) Provisional application No. 60/133,143, filed on May 7, 1999.

(51) Int. Cl.[7] ............................................. G06F 17/50
(52) U.S. Cl. .................................................. 716/2; 716/1
(58) Field of Search ........................................ 716/1–21

(56) References Cited

U.S. PATENT DOCUMENTS

| | | | | |
|---|---|---|---|---|
| 5,543,640 A | * | 8/1996 | Sutherland et al. | 257/202 |
| 5,825,662 A | * | 10/1998 | Trimberger | 364/491 |
| 5,838,954 A | * | 11/1998 | Trimberger | 395/500 |
| 5,930,499 A | * | 7/1999 | Chen et al. | 395/500.09 |

* cited by examiner

*Primary Examiner*—Vuthe Siek
(74) *Attorney, Agent, or Firm*—Pennie & Edmonds LLP

(57) ABSTRACT

A method of designing a circuit includes the step of establishing a matrix of circuit modules including sub-sets of circuit modules. A slice of circuit modules aligned along a first axis is selected from the matrix of circuit modules. The slice of circuit modules is replicated along a second axis to construct a logic structure with uniform height and width.

18 Claims, 11 Drawing Sheets

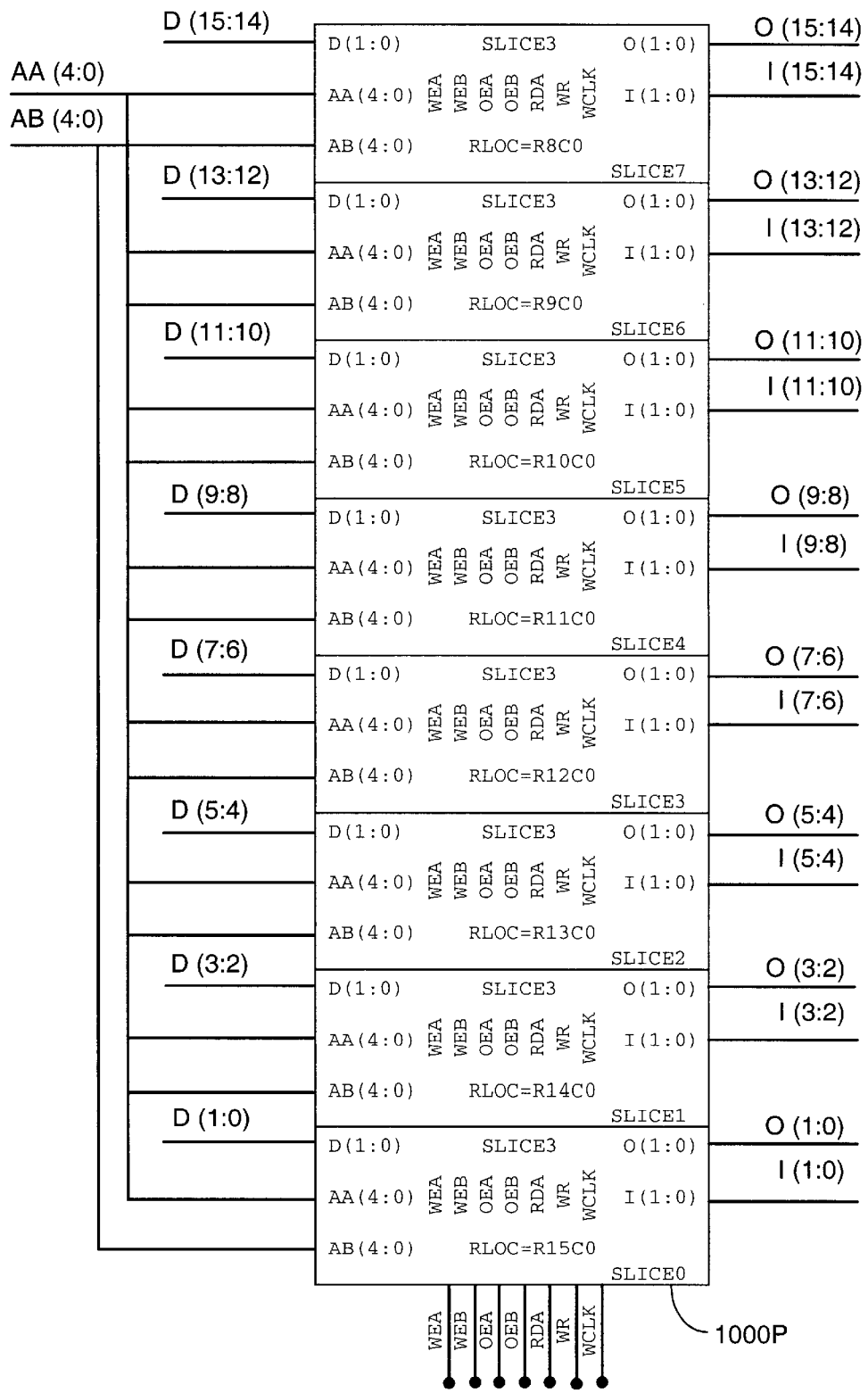
FIG. 11 - Continued

APPARATUS AND METHOD FOR DESIGNING A CIRCUIT USING MINIMUM SLICE CONSTRUCTION AND REPLICATION

This application claims priority to the provisional patent application Ser. No. 60/133,143, filed May 7, 1999.

BRIEF DESCRIPTION OF THE INVENTION

This invention relates generally to the design of integrated circuits. More particularly, this invention describes a technique for generating compact data structures in integrated circuits.

BACKGROUND OF THE INVENTION

Conventional mapping, placing, and routing tools treat the entirety of a netlist as a homogeneous unit. The disadvantage of this approach is that the whole netlist is treated as having homogeneous characteristics—an assumption that is most often false. For example, a typical netlist comprises about 75% datapath, or "structured," functions and about 25% random, or "unstructured," functions. Most advanced methodologies are concerned with sophisticated ways to map, place, and route the unstructured functions, which represent the smaller proportion of the netlist. That is, the majority of a netlist is typically subjected to map, place, and route algorithms that have been optimized for the unstructured functions. This results in map, place, and route inefficiencies for the majority, structured portion of a netlist. This utilization inefficiency typically results in performance degradation.

Algorithms that do treat the structured portion of a netlist with any difference from the unstructured portion of a netlist are typically limited to arranging the structured portions according to simple, bit-sequential rules. For example, an object "A" may be arranged in a column such that its least and most significant elements are at opposite ends of the column. Typically, this arrangement is made without any regard for other structured objects. Specifically, another object "B" may be similarly arranged, but object "B" is not arranged by taking into account the structure of object "A", and conversely, object "A" is not arranged by taking into account the structure of object "B." Overall, this individual treatment of structured objects results in less than optimal map, place, and route results for the netlist as a whole.

In view of the foregoing, it would be highly desirable to use an algorithm that would recognize the structured portion of a netlist and apply to the whole structure an optimal map, place, and route results for the netlist as a whole.

SUMMARY OF THE INVENTION

A method of designing a circuit includes the step of establishing a matrix of circuit modules including sub-sets of circuit modules. A slice of circuit modules aligned along a first axis is selected from the matrix of circuit modules. The slice of circuit modules is replicated along a second axis to construct a logic structure with uniform height and width.

The invention provides a methodology for constructing a logic structure which will map, place, and route well. The technique of the invention takes advantage of the inherent regularity in a structured netlist to construct a logic structure optimal for mapping, placing, and routing. The invention generates a compact data structure, resulting in minimum resource consumption and maximum circuit performance. When applied to Field Programmable Logic Devices, the technique of the invention yields approximately 4:1 resource savings and a performance gain of approximately 10:1.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

The Minimum-Slice (Min-Slice) Methodology of the invention is a technique for constructing a data path Logic Structure comprised of data path modules. In contemporary design environments, modules are created autonomously and then placed into a circuit. With the Min-Slice Methodology, modules are co-aligned along one axis, sliced into a second axis, and the slice is replicated in the first axis to create a Logic Structure functionally equivalent to the whole of the original source modules. The "slice" represents the minimum common contribution required from each module such that in the replication step, the whole of all the source module functionality is recovered. An important aspect of the Min-Slice is its relative physical information; the determination of this information is dependent upon the target technology.

Figure 1:
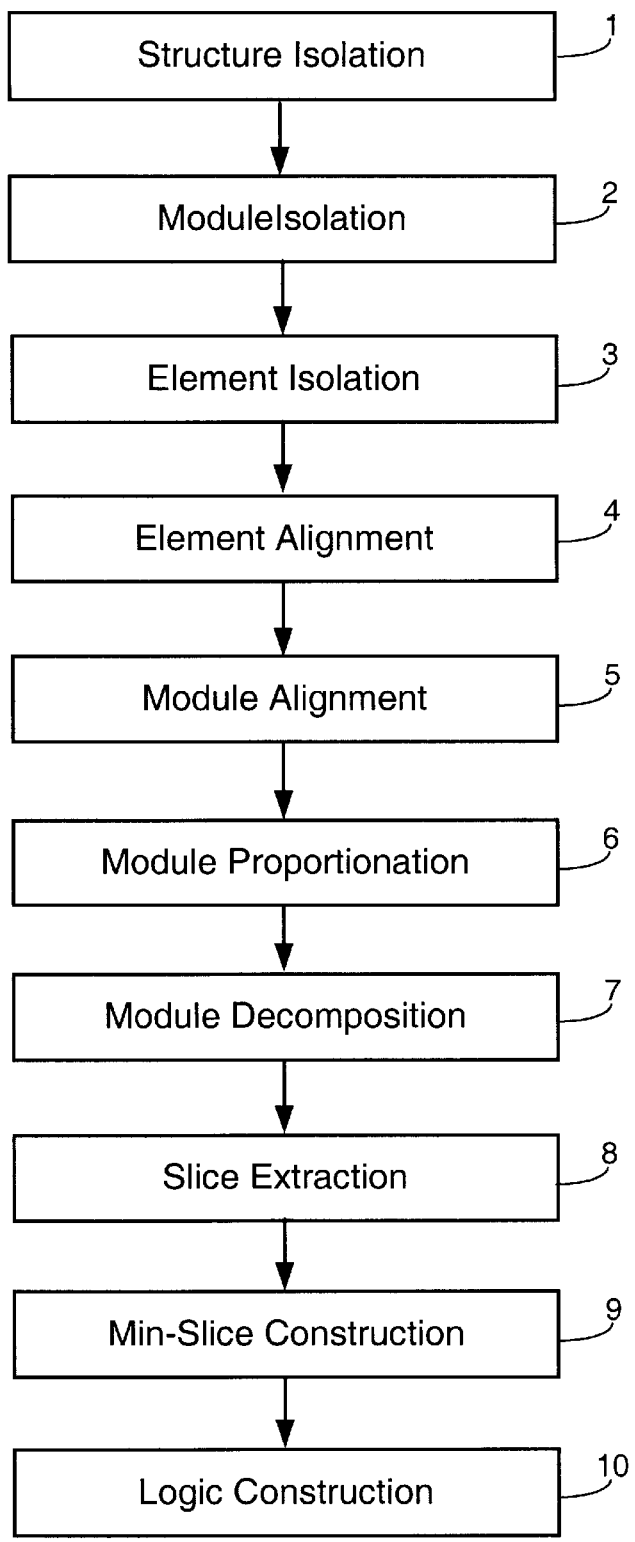
FIG. 1 illustrates processing steps performed in accordance with an embodiment of the invention.

As shown in FIG. 1, the Min-Slice Construction Methodology steps are as follows: (1) structure isolation; (2)

module isolation; (3) element isolation; (4) element alignment; (5) module alignment; (6) module proportionation; (7) module decomposition; (8) slice extraction; (9) min-slice construction; and (1) logic structure construction.

The description of the invention relies upon the following definitions:

Netlist: A generic listing of logic elements and their interconnections that constitute a logic circuit. Those skilled in the art will appreciate that the netlist may be in any one of many known forms, such as an EDIF netlist.

Module: A logic function comprising elements associated by structure; examples of modules include but are not limited to registers, counters, adders, subtracters, and RAM arrays.

Element: The basic component of a module; the logic unit required to perform a one bit function of the module.

Structure: Uniformity of logic and interconnect properties such as fanout (high), skew (low), distance (far), or destinations (common).

Structured Netlist: A netlist of structured modules.

Bit-Slice: A subset of a structured netlist comprising elements with connections to the same bit or bits between two or more modules; all such related elements and their interconnect.

Min-Slice: The minimum set of one or more bit-slices yielding best-fit logic mapping and interconnect routing; typically, but not necessarily, the elements and interconnect of the least significant bit.

Best-Fit: The relative mapping, placement, and routing constraints of Min-slice elements which consume the minimum of logic and routing resources and which yield the maximum performance.

Logic Structure: The set of best-fit modules which have been decomposed and reassembled into a single structure using the Min-Slice Construction Methodology.

Composite Netlist: A netlist representing the entirety of a logical design implementation, comprising two or more netlist fragments, such as a structured fragment and an unstructured fragment.

Furcated Netlist: A netlist decomposed into fragments.

Figure 1A:
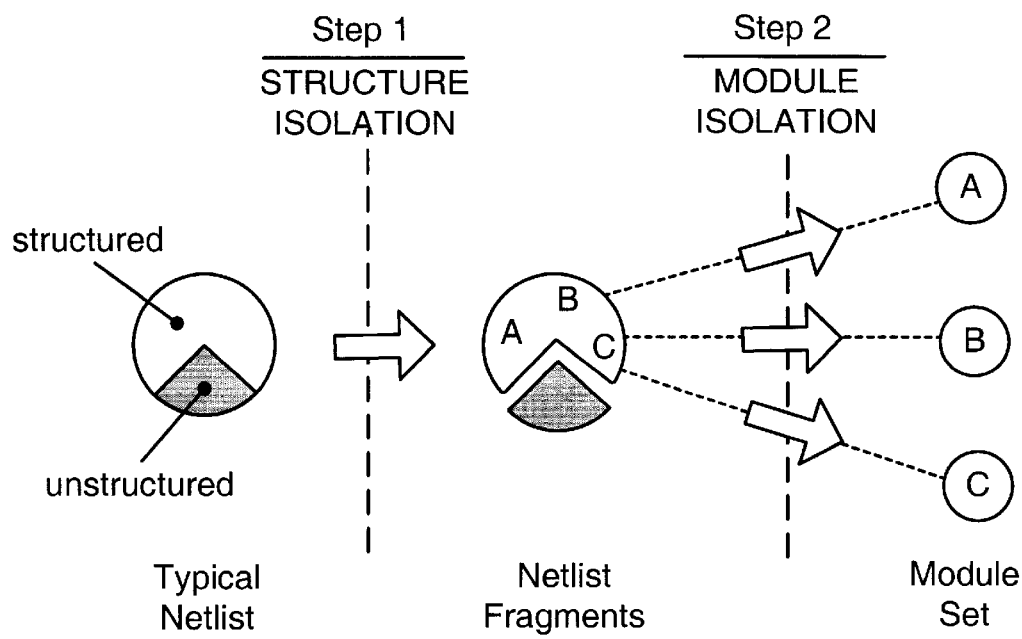
FIG. 1A illustrates structure and modulation isolation operations performed in accordance with an embodiment of the invention.
Figure 2:
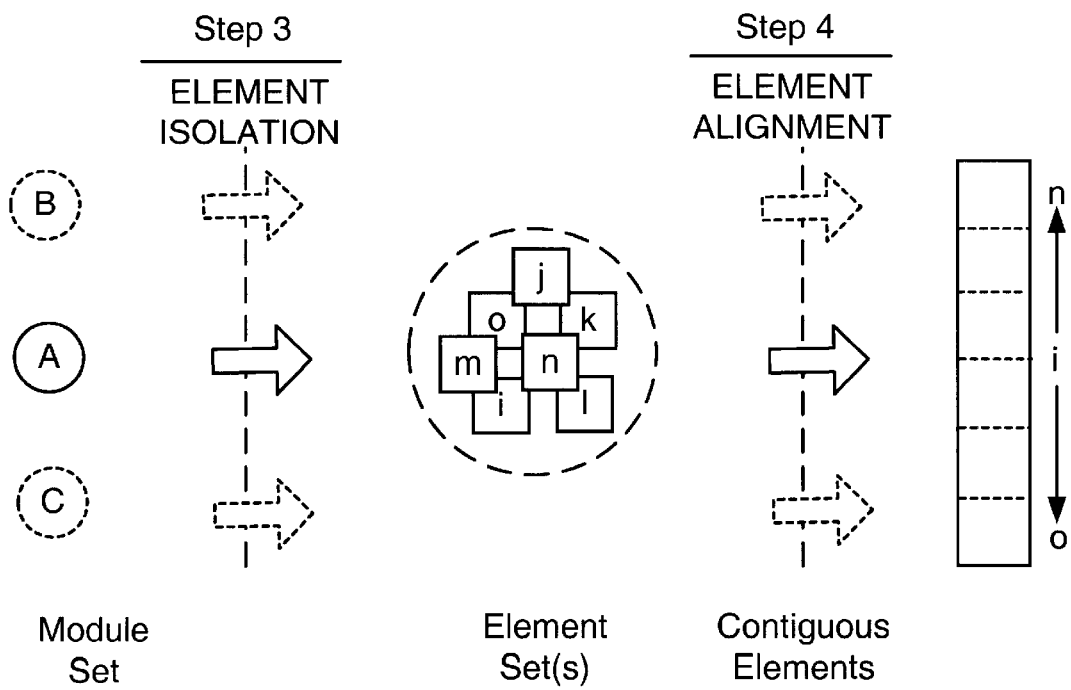
FIG. 2 illustrates element isolation and alignment operations performed in accordance with an embodiment of the invention.
Figure 3:
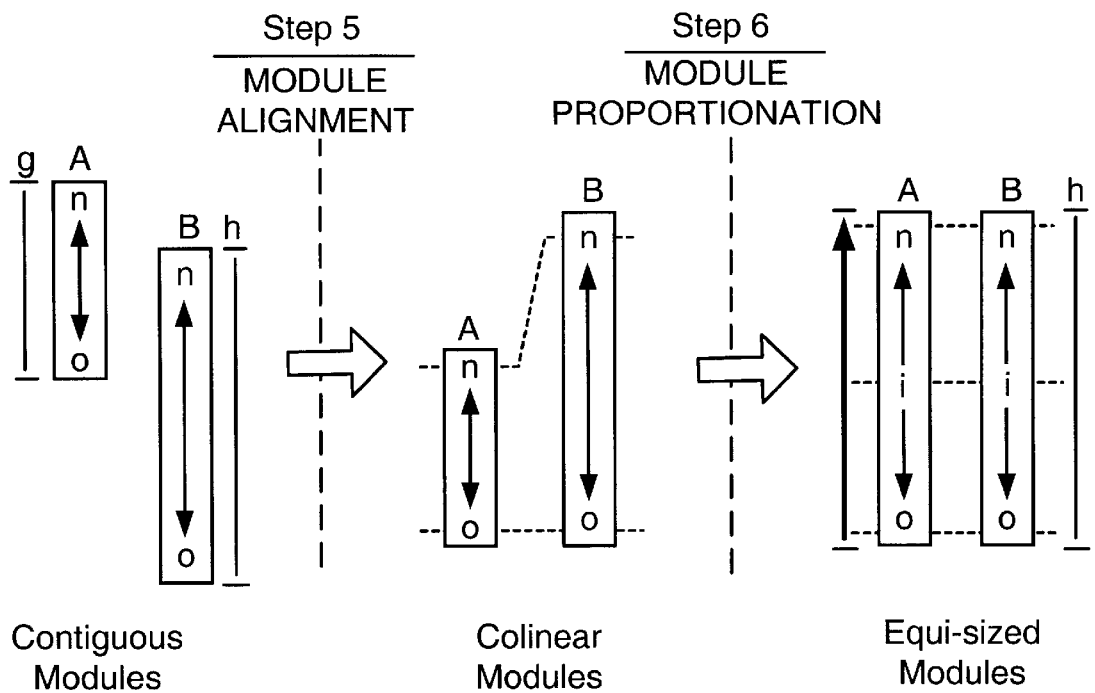
FIG. 3 illustrates module alignment and proportionation operations performed in accordance with an embodiment of the invention.
Figure 4:
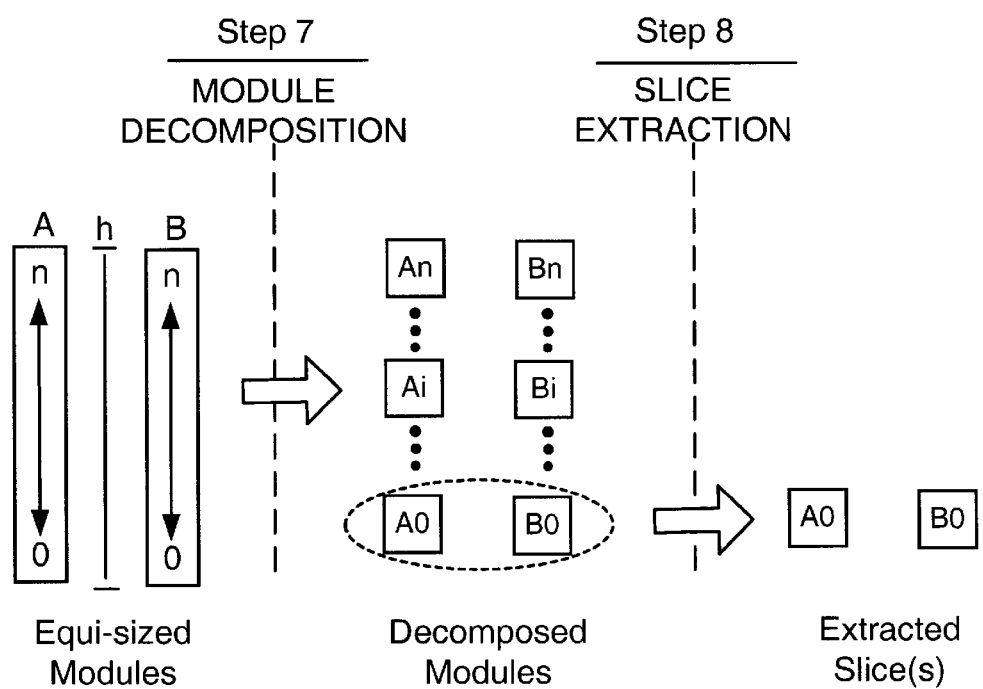
FIG. 4 illustrates module decomposition and slice extraction operations performed in accordance with an embodiment of the invention.
Figure 5:
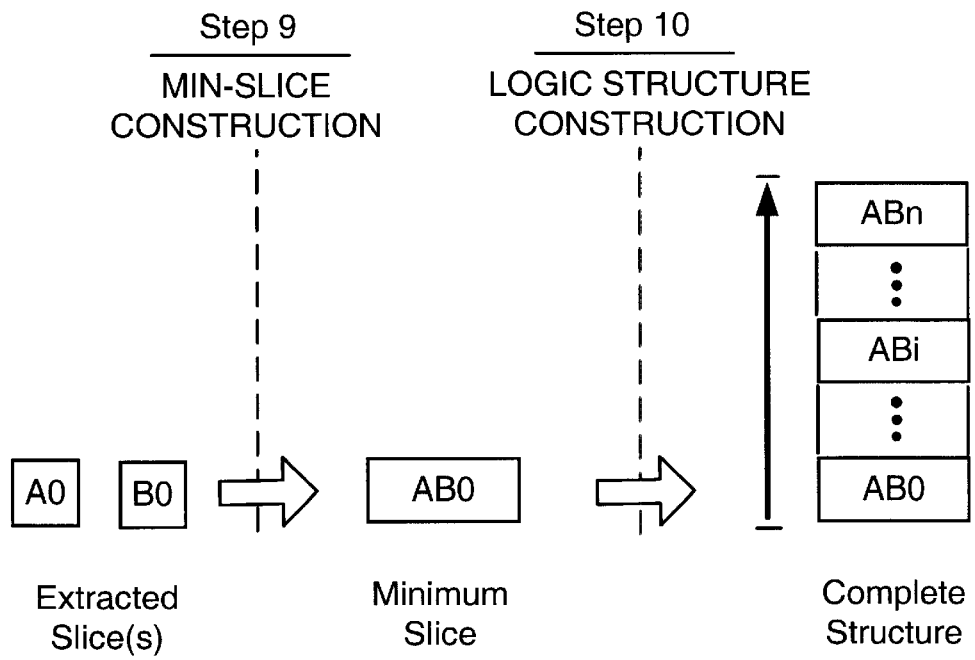
FIG. 5 illustrates Min-Slice construction and replication operations performed in accordance with an embodiment of the invention.

FIG. 1A illustrates structure and module isolation. FIG. 2 illustrates element isolation and alignment. FIG. 3 illustrates module alignment and proportionation. FIG. 4 illustrates module decomposition and slice extraction, while FIG. 5 illustrates minimum slice construction and replication.

FIGS. 1A–3, depicting the initial six steps of the Logic Structure Construction Methodology, are not novel in and of themselves. All six of those steps are currently in practice, albeit not necessarily for the purposes of constructing an optimal Logic Structure as disclosed herein. That being said, the Logic Structure Construction Methodology proposes new and superior methods—the preferred methodology—for accomplishing the same steps. FIGS. 4 and 5 embody the primary aspects of the invention.

In the preferred methodology, modules are designed in an environment that facilitates steps five and six (Module Alignment & Proportionation) without the need for steps one through four. Steps one through six are included here for completeness for environments that do not embody all aspects of the preferred methodology.

The preferred methodology for Logic Structure Construction is a Structure Planner software module, which is a design environment for proposing functionality, while considering such physical constraints as the best-fit for a target architecture. The processing of the invention is characterized as follows:

STEP 1: Structure Isolation

The first step is the separation of structured netlists from unstructured netlists. The goal of step one is to extract from a composite netlist the logic and netlists related to one another by structure and then to apply construction algorithms tailored to the structured entities. Such isolation of structure can be accomplished either by extraction from a composite netlist, or, in the preferred methodology, by autonomous generation. The output of this step is a furcated netlist comprised of a structured netlist fragment and an unstructured netlist fragment. In the absence of a Structure Planning tool, the isolated structured netlist fragment is input to step two.

The unstructured netlist fragment corresponds to unstructured architectural components that have fine granularity, short route segments, high timing skew, small signal fan-out, wide signal fan-in variable organization, and logic resource bias. On the other hand, a structured netlist fragment corresponds to structured architectural components that have coarse granularity, long route segments, low timing skew, large signal fan-out, narrow signal fan-in, repetitious organization, and routing resource bias.

The distinction between structured and unstructured architectures is more fully appreciated with a specific discussion of individual parameters, such as the number of inputs employed and the number of logic levels required to achieve a particular function. If the number of inputs is large (i.e., 5 or more) or if the inputs are random, then the logic is likely to be "wide," because the logic requires a large number of independent terms. For example, a state machine typically includes many conditions for returning to the start-up state. These conditions have equal or independent scope. Independence results in a small number (i.e., 3 or less) of logic levels; thus, the logic is also "shallow." If the number of inputs is small (i.e., 5 or less) or if the inputs are relative (i.e., from adjacent states), then the logic is "narrow," because the logic requires a large number of dependent terms. For example, an arithmetic object may have a dominant reset input to which all other controls are dependent upon (i.e., reset must be unasserted for the other controls to contribute to a "next-state"). The arithmetic object may have a clock enable signal dominant over the remaining control lines. Dependency results in a large number (i.e., 6 or more) of logic levels; thus, the logic is also "deep."

Unstructured logic, such as state machines, often comprises non-uniform (random) logic most suitably mapped onto physical resources that has fine granularity, short route resource segments, and include function generators that accept a large number of inputs and generate a small number of outputs. Such input functions can be referred to as "wide" and "shallow."

On the other hand, structured logic, such as counters, is inherently regular and frequently has large fan-in and large fan-out interconnect. Furthermore, datapath logic, being of fixed, limited, or pre-determined functionality, has next-state functions comprising a small number of input variables. Such input functions can be referred to as "narrow" and "deep."

FIG. 1A illustrates a typical netlist subdivided into two fragments: 1) an unstructured fragment (shaded), and 2) a structured fragment. The structured fragment shown consists of three modules, A, B and C.

STEP 2: Module Isolation

The second step of module isolation entails the separation of structured modules from one another. The goal of step two is to create autonomous module element sets, once again, for the purposes of tailored treatment. Such isolation of modules can be accomplished either by extraction from a structured netlist, or, in the preferred methodology, by autonomous generation. The output of this step is a set of module intraconnect netlist fragments and one interconnect netlist. In the absence of a Structure Planning tool, these fragments are input to step three. FIG. 1 illustrates the structured fragment subdivided into it's constituent module set comprised of modules A, B, and C.

STEP 3: Element Isolation

Step 3 involves the separation of module elements from one another. The goal of such element isolation is to create autonomous element sets for autonomous alignment treatment. Such isolation can be accomplished either by extraction from a module intraconnect netlist, or, in the preferred methodology, by autonomous generation. The output of this step is a collection of sets of element intraconnect netlists and one set of element interconnect netlists. The intraconnect netlists comprise connections within an element; the interconnect netlists comprise connections between elements. In the absence of a Structure Planning tool, the isolated intraconnect netlist is input to step four.

FIG. 2 illustrates the elements of Module A isolated in a set [0, i, j, k, l, m, n]. The elements of all modules, such as B and C (not shown) would be similarly isolated.

STEP 4: Element Alignment

Step 4 involves the contiguous alignment of module elements in one dimension. The goal of this step is to impose physical uniformity on each module by contiguously aligning its elements. Alignment may be inherited from module generation software; also, some alignment can be automatically imposed by structure analysis software, or can be interactively introduced by contemporary Floorplanning software. In the preferred methodology, element alignment is produced by an interactive Logic Structure Construction tool. In the absence of a Structure Planning tool, the output of this step, the set of inter-element alignment constraints, is input to step five.

FIG. 2 illustrates the Module A elements [0, i, j, k, l, m, n] aligned sequentially with the least significant bit, 0, at one end and the most significant bit, n, at the other end.

STEP 5: Module Alignment

Module alignment of step 5 involves the parallel alignment of modules such that the corresponding least significant elements are adjacent in a second dimension. The goal of this step is to prepare for step six. Such module alignment can be accomplished with contemporary Floorplanning software, or, in the preferred methodology, by Logic Module Construction software. In the absence of a Structure Planning tool, the output of this step, a set of inter-module alignment constraints, is input to step six.

FIG. 3 illustrates that compact Module A of height g is shorter than Module B of height h. Shown in the center of FIG. 3, modules A and B are coaligned by their least significant bit, 0. Note that, due to the differing module heights, bit n is not aligned.

STEP 6: Module Proportionation

Step 6 involves the reproportioning of modules aligned in one dimension such that all corresponding elements of all modules are aligned in a second dimension. The goal of this step is to create a rectangular structure of uniform-height modules. Such reproportioning can be automatically imposed by structure analysis software, or, may be, with great labor, interactively introduced by contemporary Floorplanning software. In the preferred methodology, module proportionation is conveniently produced by an interactive Logic Structure Construction tool. In the absence of a Structure Planning tool, the output of this step, a modification to the inter-module alignment constraints from step five, is input to step seven.

In sum, the goal of Step 6 is to align related bits. If modules have the same number of related bits, then they will be proportioned to the same height. However, if one module has fewer bits, step 6 will cause it to be of less height. For example, in FIG. 3, if module A only contained "i" bits, then, after step 6, it would end up being of a height less than "h".

STEP 7: Module Decomposition

Step 7 involves the division of equi-sized modules into co-aligned elements. The goal of this step is to decompose the co-aligned modules into sets of elemental components with co-alignment constraint properties. This step is differentiated from step three, Element Isolation, in that the elements of step three do not carry proportionation information. The functionality of this step is believed to be novel and non-obvious. In the preferred methodology, co-aligned modules are created with readily severable elements, each with co-alignment and proportionation constraint information. In the absence of a Structure Planning tool, the output of this step, a set of proportionally co-aligned modules, is input to step eight.

FIG. 4 illustrates equi-sized and co-aligned Modules A and B decomposed into adjacent element sets [A, B][0:n]. That is, the figure shows an AB module for each of bits 0 through n in common.

STEP 8: Slice Extraction

The goal of step 8 is to affiliate co-aligned elements of two or more modules into a concatenatable entity or "slice". The goal of this step is to identify and extract a minimum set of laterally "common" elements. Each slice shall consist of all the elements and associated interconnect for one or more module bits. Unlike the previous seven steps, step eight may be architecture dependent, that is, the extracted module slices and the determination of commonality is best realized with knowledge of the target architecture. This operation is believed to be novel and nonobvious. In the preferred methodology, Logic Module Construction by use of a Structure Planner, slice extraction is readily facilitated.

In FIG. 4, Modules A and B are decomposed into equi-sized, single-bit modules where module A0 and B0 are extracted for Min-Slice Construction (step nine). However, depending upon module complexity and architectural implementation options, it may be decided that several bits of one module may be "in common" with a different number of bits in another module.

STEP 9: Min-Slice Construction

Step 9 involves joining module slices into a single, replicable entity or a "minimum slice". The goal of this step is to create the least common denominator comprising a sufficient functionality from each module such that, upon replication, the entirety of all modules is recreated. In the simplistic case, the min-slice comprises single-bit functionality from each module. However, due to initial module complexity or target architectural constraints, it may be advantageous to construct min-slices comprised of unequal bit contributions (but equal by some other resource metric). The operation of this step is also believed to be novel and nonobvious. The output of this step, a Min-Slice module, is input to step ten.

FIG. 5 illustrates that extracted slices A0 and B0 are joined to create Min-Slice AB0.

STEP 10: Logic Structure Construction

Step 10 involves the operation of replicating the min-slice to regenerate the entire original functionality—the "logic structure" . The goal of this step is to recreate a rectilinear structure comprising the functionality and interconnectivity of all source modules. In addition, the completed structural netlist contains the physical relational constraints for proper construction of the rectilinear structure in the target architecture. This step constitutes a novel and nonobvious operation. The output of this step is the completed treatment of the structured portion of the netlist isolated in step one.

In FIG. 5 the single bit AB0 Min-Slice is replicated n times, once for each bit. For a more complex Min-Slice, the-number of replications will be a function of the least common denominator. For example, if a module x is 16 bits high while another module y is 32 bits high, then the Min-Slice may be composed of one bit from module x and two bits of module y thereby requiring 16 replications of the Min-Slice to reconstruct the whole logic structure.

Figure 6A:
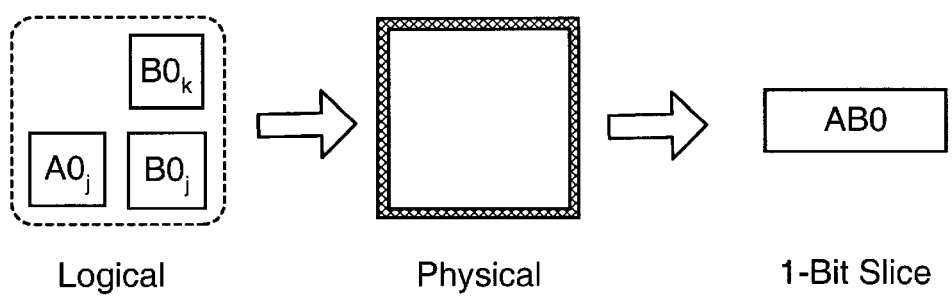
FIGS. 6(A) and 6(B) illustrate Min-Slice construction composition operations performed in accordance with an embodiment of the invention.

FIG. 6A: One-Bit Min-Slice

In FIG. 6A, on the left, one-bit module A and B slices contribute elements to construction of the Min-Slice. Module A comprises a single element, A0j, and module B comprises two elements, B0j and B0k. In this example, considerations of the target architecture conclude that elements A0j, B0j, and B0k optimally map together (center), and therefore constitute the best min-slice, a one-bit slice (right).

Figure 6B:
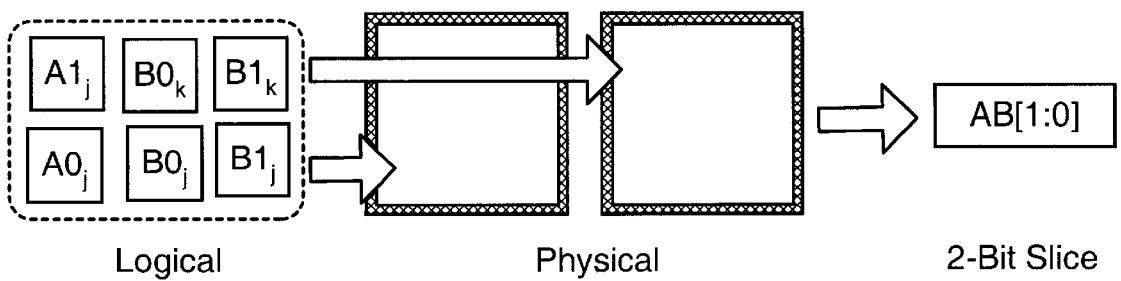

FIG. 6B: Two-Bit Min-Slice

In FIG. 6B, on the left, two-bit module A and B slices contribute elements to construction of the Min-Slice. Module A comprises two elements, A0j and A1j, and module B comprises four elements, B0j, B0k, B1j, and B1k. In this example, considerations of the target architecture conclude that all six elements optimally map together (center), and therefore constitute the best min-slice, a two-bit slice (right).

The "Physical" representations (centers of FIGS. 6A and 6B) illustrate resources consumed. FIG. 6A illustrates an example in which module elements map into a single logic resource (often referred to as a programmable or reconfigurable logic block or element); FIG. 6B illustrates an example in which module elements map into two logic resources. Observe that the physical resource consumption number is unrelated to the bit-slice number.

Figure 7:
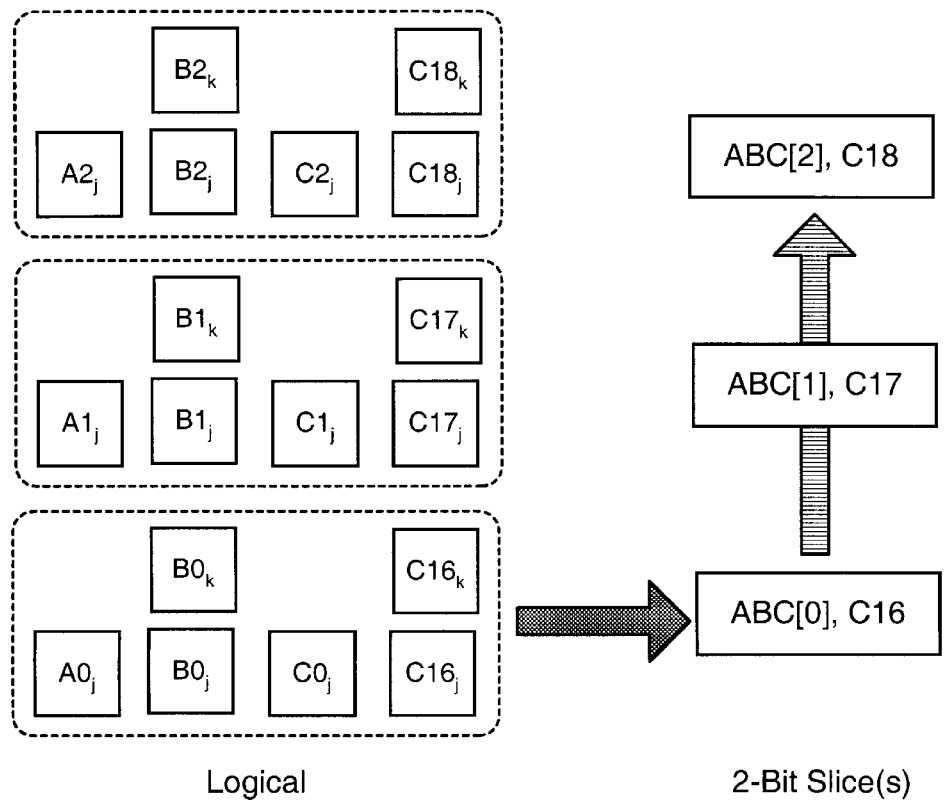
FIG. 7 illustrates logic structure construction in accordance with an embodiment of the invention.

FIG. 7—A More Complex Example

FIG. 7 illustrates a more complex example of Min-Slice Construction involving three modules, A, B, and C. In FIG. 7, three modules, A, B, and C, contribute elements to the Min-Slice. Module A is composed of one-bit, single-element A0j; module B is composed one-bit, dual-element B0[j,k]; and module C is composed of one-bit, single-element C0j and one-bit, dual-element C16[j,k]. In this example, mapping these six elements together may represent the best, two-bit Min-Slice-slice ABC[0],C16. This two-bit Min-Slice then replicated can implement the remaining functionality, i.e. ABC[1],C17 and ABC[2],C18 are of the same form.

Observe that this example approximates a case in which Modules A and B are 16-bit, Module C is 32-bit, and Module C bits are associated with Modules A and B by the following mapping:

$$C31 \rightarrow A, B[15]$$
$$C30 \rightarrow A, B[14]$$
$$C29 \rightarrow A, B[13]$$
$$\vdots \quad \vdots$$
$$C2 \rightarrow A, B[2]$$
$$C1 \rightarrow A, B[1]$$
$$C0 \rightarrow A, B[0]$$

This mapping is commonly employed in systems which need to map the upper word (16-bits) to the lower word of a 32-bit data bus. Such mapping is also commonly referred to as an "interleaved" scheme.

Figure 8:
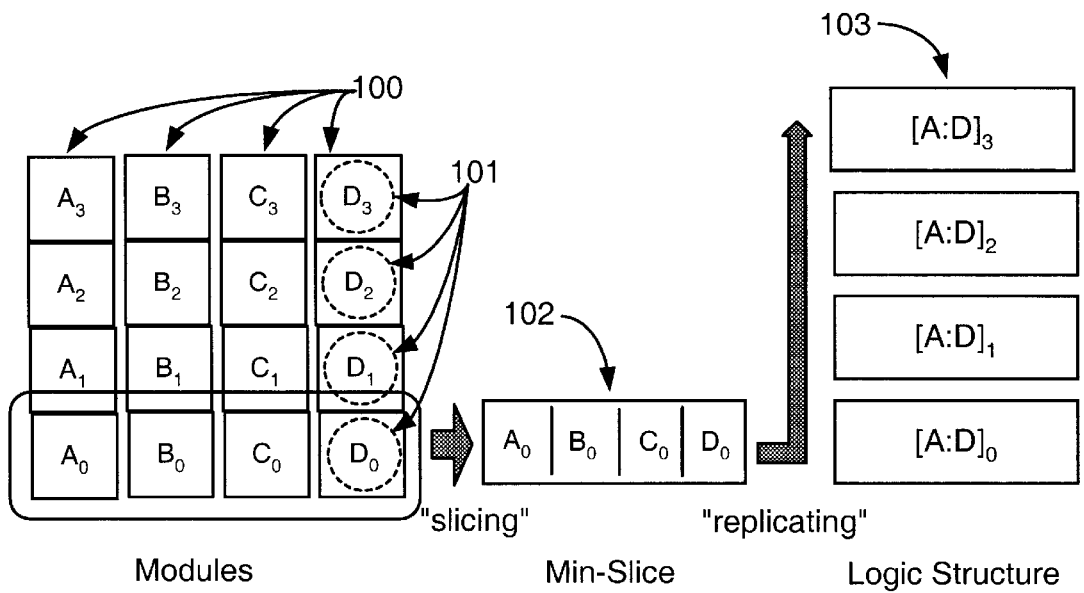
FIG. 8 illustrates logic structure construction in accordance with the Min-Slice methodology of the invention.

FIG. 8—Another Example

FIG. 8 illustrates the Min-Slice Methodology in construction of a 4×4 Logic Structure. Initially, four 4-bit modules A, B, C and D (100) comprised of four elements (101) are co-aligned in a first axis. A Min-Slice (102) is then extracted by slicing across a second axis and extracting out a minimum element set—in this illustration, the set A0, B0, C0, and D0. Finally, the Min-Slice is replicated in the first axis in the construction of the Logic Structure (103).

FIGS. 9–12—Another Example

Figure 9:
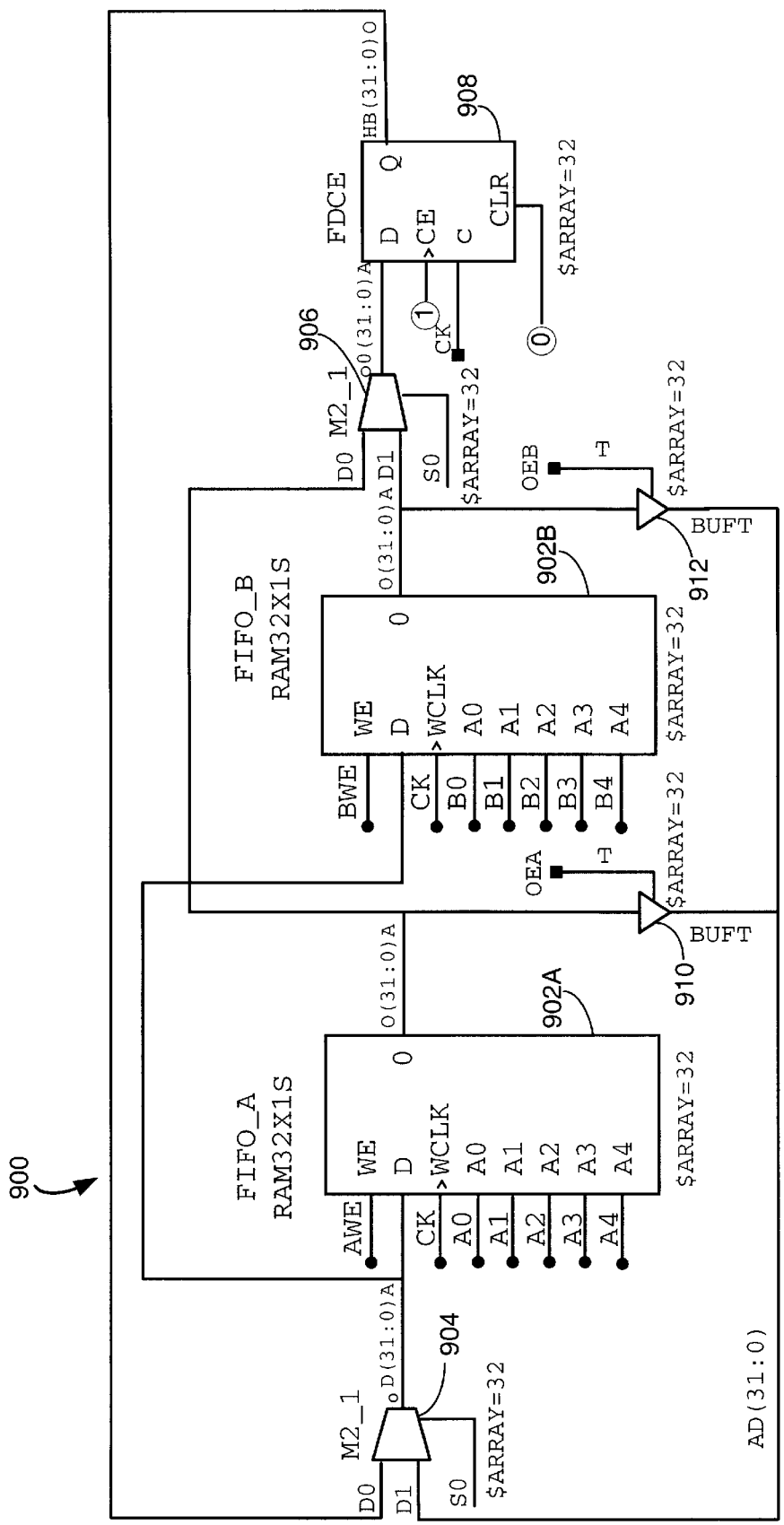
FIG. 9 illustrates a portion of a sequential read-write RAM (ping-pong AM) constructed in accordance with the prior art.

FIG. 9 illustrates a portion of a sequential read-write (Ping-Pong) RAM 900 constructed in accordance with the prior art. The circuit 900 includes individual RAM memories 902A and 902B, multiplexers 904 and 906, a flip-flop 908, and tri-state buffers 910 and 912. Each of these components is reconstructed 32 times to form a final device. The problem is that when these 32 instances are mapped, placed, and routed, the instances may not be adjacent and there may be other circuit components interspersed between the instances of the circuit 900. Prior art techniques attempt to map, place, and route the individual instances of circuit 900 may result in a set of adjacent columns with different column heights, as shown in FIG. 3. Thus, the prior art technique for implementing the circuit 900 results in an irregular shape and an inefficient utilization of resources.

Figure 10:
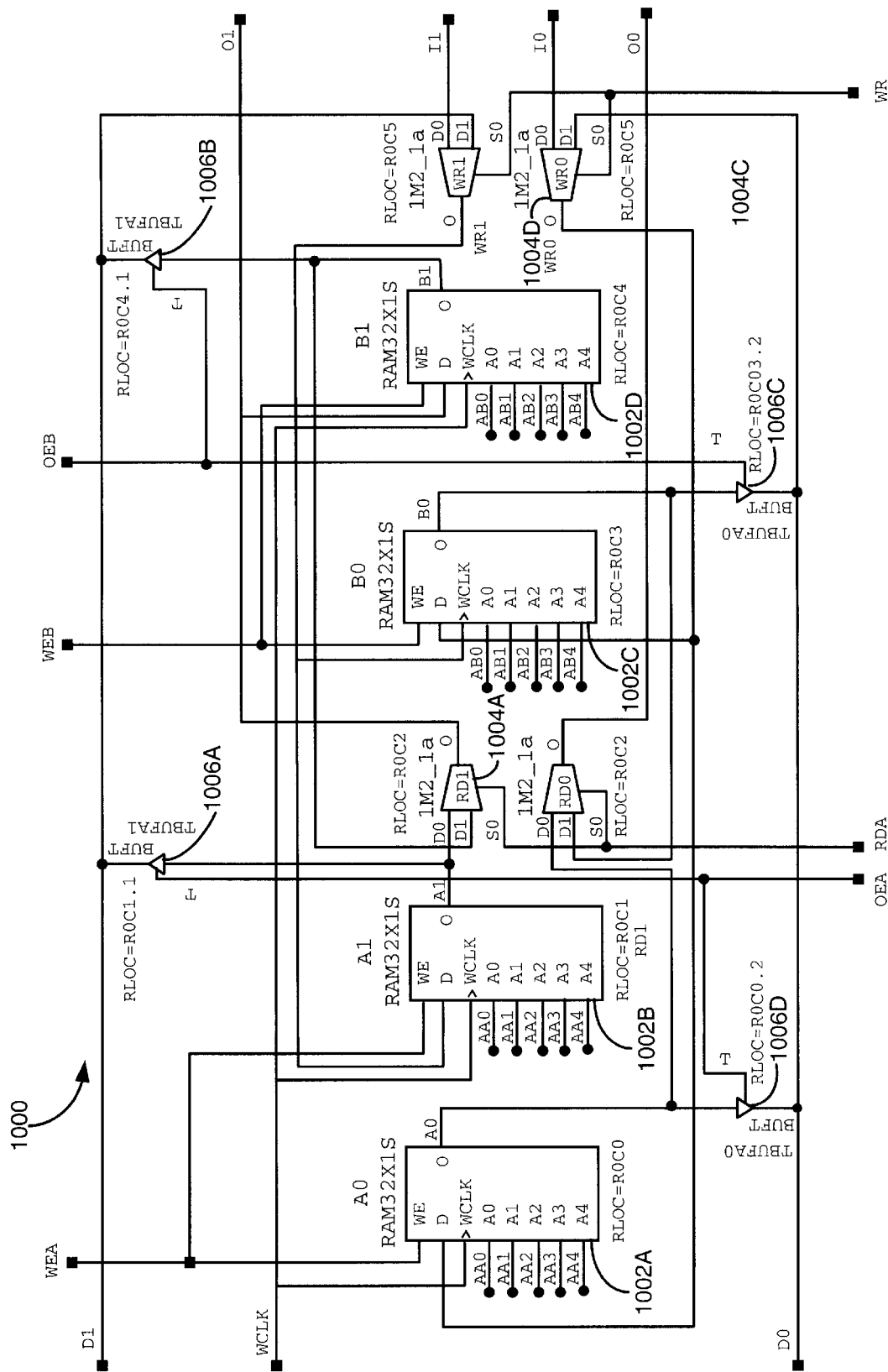
FIG. 10 illustrates a minimum slice of a sequential read-write RAM constructed in accordance with an embodiment of the invention.

FIG. 10 illustrates a minimum-slice of a sequential read-write RAM 1000 constructed in accordance with an embodiment of the invention. The circuit 1000 includes RAM cells 1002A–1002D, multiplexers 104A–104D, and tri-state drivers 1006A–1006D. It has been determined in this example that these components are necessary to preserve module functionality. The circuit 1000 has a fixed construction that is repeated for the desired size. In other words, the min-slice circuit 1000 is constructed along a first horizontal axis. The min-slice circuit 1000 can now be repeatedly replicated along a vertical axis to form a column.

Figure 11:
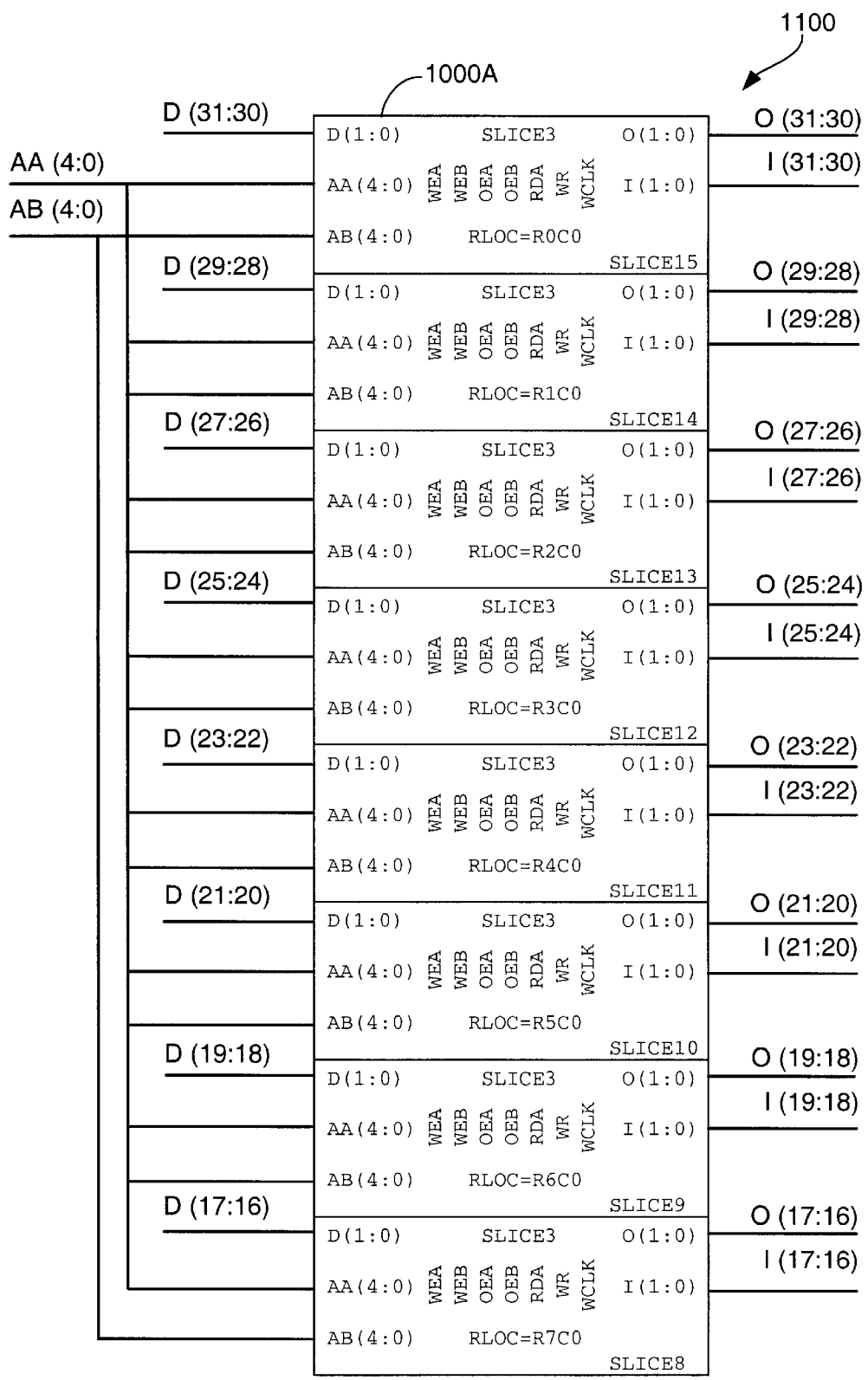
FIG. 11 illustrates a grouping of minimum slice sequential read-write RAMs in accordance with an embodiment of the invention.
Figure 12:
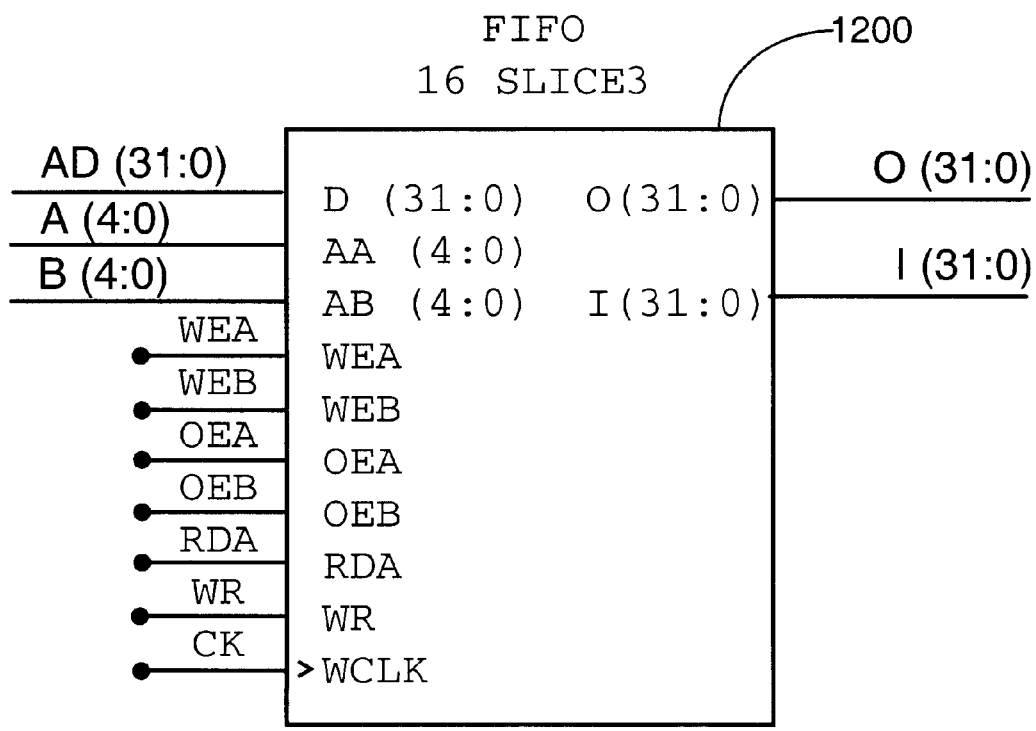
FIG. 12 illustrates a single object corresponding to the circuit of FIG. 11.

FIG. 11 illustrates a stack of 16 circuits 1000A–1000P to form a 32-bit circuit. This stacked structure may then be treated as a unitary device 1200, as shown in FIG. 12. This unitary device 1200 stands in contrast to the prior art which maps, places, and routes a functionally equivalent circuit in an irregular manner—with an irregular footprint and other circuit elements interposed therein.

Figure 13:
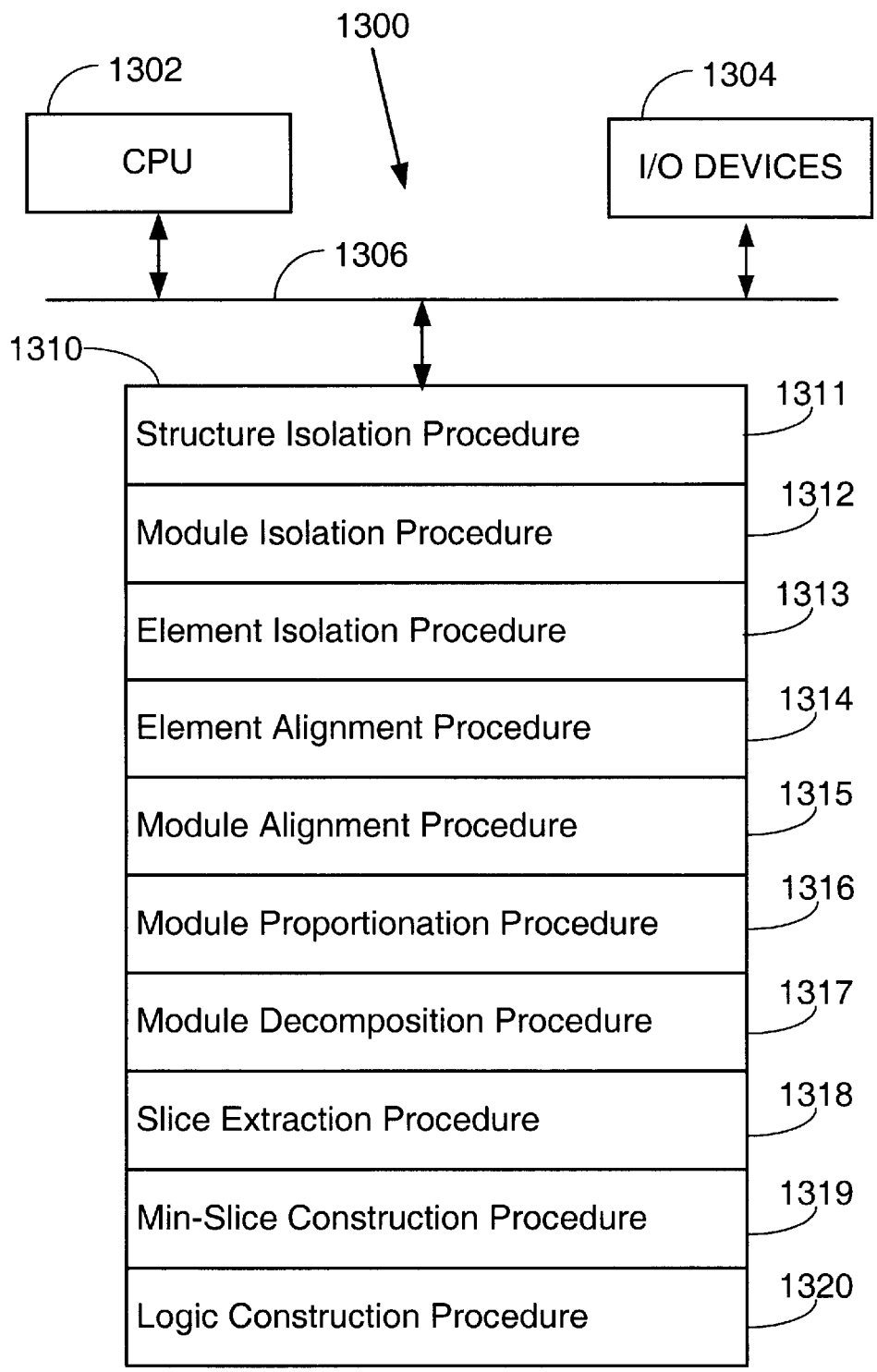
FIG. 13 illustrates a general purpose computer configured to implement the technique of the invention.

FIG. 13 illustrates a general purpose computer 1300 configured to implement the technique of the invention. The computer 1300 includes a central processing unit 1302 and a set of input/output devices 1304 linked by a bus 1306. The input/output devices include a keyboard, mouse, video display, printer, and the like. A memory 1310 is also connected to the bus 1306. The memory 1310 stores executable programs implemented to perform the method of the invention. In particular, the memory 1310 stores a structure isolation procedure 1311 to implement the previously described structure isolation step 1, a module isolation procedure 1312 to implement the module isolation step 2, an element isolation procedure 1313 to implement the element isolation step 3, an element alignment procedure 1314 to implement the element alignment operation 4, a module alignment procedure 1315 to implement the module alignment operation 5, a module proportionation procedure 1316 to implement the module proportionation operation 6, a module decomposition procedure 1317 to implement the module decomposition operation 7, a slice extraction procedure 1318 to implement the slice extraction operation 8, a min-slice construction procedure 1319 to implement the min-slice construction operation 9, and a logic construction procedure 1320 to implement the logic construction operation 10.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of designing a circuit, said method comprising the steps of:

establishing a matrix of circuit modules including sub-sets of circuit modules;

selecting from said matrix of circuit modules a slice of circuit modules aligned along a first axis; and replicating said slice of circuit modules along a second axis to construct a logic structure with uniform height and width.

2. The method of claim 1 wherein said selecting step includes the step of identifying a set of circuit components required to preserve uniform circuit module functionality.

3. The method of claim 1 further comprising the step of processing said logic structure with uniform height and width as a unitary and autonomous module.

4. The method of claim 3 further comprising the step of mapping, placing, and routing said logic structure with uniform height and width as a unitary and autonomous module within a larger circuit.

5. The method of claim 1 further comprising the step, performed prior to said establishing step, of isolating circuit structures in a netlist to produce isolated circuit structures.

6. The method of claim 5 further comprising the step of isolating modules within said isolated circuit structures to produce isolated circuit module structures.

7. The method of claim 6 further comprising the step of isolating selected elements within said isolated circuit module structures to produce isolated circuit module element structures.

8. The method of claim 7 further comprising the step of aligning said isolated circuit module element structures to produce aligned isolated circuit modules.

9. The method of claim 8 further comprising the step of uniformly proportioning said isolated circuit modules to produce said matrix of circuit modules.

10. A computer readable memory to direct a computer to function in a specified manner, comprising:

a first set of executable instructions to establish a matrix of circuit modules including sub-sets of circuit modules;

a second set of executable instructions to select from said matrix of circuit modules a slice of circuit modules aligned along a first axis; and a third set of executable instructions to replicate said slice of circuit modules along a second axis to construct a logic structure with uniform height and width.

11. The computer readable memory of claim 10 further comprising executable instructions to identify a set of circuit components required to preserve uniform circuit module functionality.

12. The computer readable memory of claim 10 further comprising executable instructions to process said logic structure with uniform height and width as a unitary and autonomous module.

13. The computer readable memory of claim 12 further comprising executable instructions for mapping, placing, and routing said logic structure with uniform height and width as a unitary and autonomous module within a larger circuit.

14. The computer readable memory of claim 10 further comprising executable instructions to isolate circuit structures in a netlist to produce isolated circuit structures.

15. The computer readable memory of claim 14 further comprising executable instructions to isolate circuit structures to produce isolated circuit module structures.

16. The computer readable memory of claim 15 further comprising executable instructions to isolate selected elements within said isolated circuit module structures to produce isolated circuit module element structures.

17. The computer readable memory of claim 16 further comprising executable instructions to align said isolated circuit module element structures to produce aligned isolated circuit modules.

18. The computer readable memory of claim 17 further comprising executable instructions to uniformly proportion said isolated circuit modules to produce said matrix of circuit modules.

* * * * *